United States Patent [19]
Wong et al.

[11] Patent Number: 5,815,425
[45] Date of Patent: Sep. 29, 1998

[54] COMBINED DIGITAL WRITE AND ANALOG REWRITE PROCESS FOR NON-VOLATILE MEMORY

[75] Inventors: Sau C. Wong, Hillsborough; Hock C. So, Redwood City, both of Calif.

[73] Assignee: Invox Technology, Campbell, Calif.

[21] Appl. No.: 847,234

[22] Filed: Apr. 30, 1997

Related U.S. Application Data

[62] Division of Ser. No. 535,441, Sep. 28, 1995, Pat. No. 5,745,409.

[51] Int. Cl.$^6$ ..................................................... G11C 11/40
[52] U.S. Cl. .......................................... 365/45; 365/185.03
[58] Field of Search .................................. 365/45, 185.03

[56] References Cited

U.S. PATENT DOCUMENTS

| | | | |
|---|---|---|---|
| 3,947,827 | 3/1976 | Dautremont, Jr. et al. | 365/45 |
| 4,046,995 | 9/1977 | Salley | 235/61.6 R |
| 4,209,852 | 6/1980 | Hyatt | 365/45 |
| 4,271,486 | 6/1981 | Dagostino et al. | 365/45 |
| 4,280,196 | 7/1981 | Hornak et al. | 365/45 |
| 5,218,640 | 6/1993 | Morio et al. | 381/30 |

*Primary Examiner*—Son T. Dinh
*Attorney, Agent, or Firm*—Skjerven, Morrill, MacPherson, Franklin & Friel; David T. Millers

[57] ABSTRACT

A non-volatile memory stores both analog and digital information in an array, and has digital and analog read and write circuits and dual I/O interfaces which allow input and output signals in digital or analog form. A user selects the input signal, output signal, and data storage formats. Each selection can be digital or analog format. On-chip analog-to-digital and digital-to-analog converters allow conversion of signals from one format into another. Analog signals can be read or written serially, and one embodiment includes an address counter and an internal oscillator for generating sequential addresses. An output amplifier for driving a speaker and an input amplifier for a microphone allow stored sounds to be directly recorded and reproduced. A real-time recording method in accordance with an embodiment of the invention writes digital samples to the memory using a fast digital write circuit while data is being acquired. The stored digital values are subsequently read, converted to analog form using an internal converter, and rewritten in analog form in the memory using a slower analog write circuit. The reading, converting and rewriting can be conducted entirely within the memory.

14 Claims, 8 Drawing Sheets

COMBINED DIGITAL WRITE AND ANALOG REWRITE PROCESS FOR NON-VOLATILE MEMORY

This is a division of application Ser. No. 08/535,441, filed Sep. 28, 1995, now U.S. Pat. No. 5,745,409.

BACKGROUND OF THE INVENTION

1. Field of the Invention

This invention relates to non-volatile memories which simultaneously store both analog and digital signals and to memories with user selectable input, output, and storage formats.

2. Description of Related Art

Conventional non-volatile memory, such as EPROM (Electrically Programmable Read Only Memory), EEPROM (Electrically Erasable Programmable Read Only Memory), MNOS (Metal-Nitride-Oxide-Silicon) memory, or Flash memory, contain binary memory cells which have two states. One state has a high threshold voltage, and one state has a low threshold voltage. The state of a memory cell indicates a bit of information, and a set of memory cells together indicate a multi-bit binary value. Such binary memory cells can accurately retain data for a long period, typically over ten years, because the threshold voltage of a memory cell changes slowly with time and a large change in threshold voltage is required before one state is confused with the other.

Analog non-volatile memories store analog information. Examples of analog memories are described in U.S. patent app. Ser. No. 08/333,381, entitled "HIGH RESOLUTION ANALOG STORAGE EPROM AND FLASH EPROM" which is incorporated by reference herein in its entirety. In analog memories, a range of the threshold voltages for the memory cells corresponds to a range of analog values. In some analog memories, reference memory cells track the slow leakage of charge which over a long period of time can change the threshold voltages of memory cells. The charge loss or gain measured by the reference cells is then compensated for to maintain the quality of stored analog information.

Prior art digital memory can store digital values representing analog signals if an analog-to-digital converter (ADC) converts the analog signals to digital form. During playback or readout, a digital-to-analog converter (DAC) converts the stored digital values back to analog form. Conversely, analog memory can store digital information if a DAC converts input digital values to the analog form and an ADC converts output analog signals back to digital form. ADCs and DACs are commercially available as discrete components which can be connected to the input and output ports of memories.

Some applications of memory, such as personal computer systems with multimedia capabilities, process both digital and analog signals. Some of these applications contain two types of memories, one for analog signals and one for digital signals. Other applications have discrete components such as an ADC and a DAC which convert between digital and analog forms so that analog and digital information is stored in a single memory in the same form (either analog or digital form). Either alternative adds complexity to the system design and increases system cost and power consumption. Techniques and circuits are needed to decrease the complexity and cost of memory for systems which process both analog and digital information.

SUMMARY OF THE INVENTION

In accordance with an embodiment of this invention, a non-volatile memory device stores both analog and digital information in a single memory array, and has dual I/O interfaces which allow input and output signals in digital or analog form. User configuration selects input signal format, output signal format, data storage format, and the memory allocations for analog and digital information. Accordingly, this embodiment eliminates the need for either separate analog and digital memories or discrete analog-to-digital and digital-to-analog converters. This simplifies system design, decreases system cost, and increases system flexibility and capability.

In one embodiment, a memory array contains multiple sections, each of the sections stores data in either binary or analog form. Only one form of storage at a time is allowed in each section of the memory array. During a write cycle, the user asserts an input signal to an input interface (analog or digital) and selects a write circuit to write the signal into the memory array. Digital input signals, asserted through digital input buffers, are written into the memory array in binary form. Analog signals asserted through an analog interface (analog preamplifier and amplifier in series) are written into the memory array in analog form.

In the read cycle, a read circuit and output interface read the digital or analog signals according to the form in which the data was stored. Both digital and analog signals can be accessed randomly. Digital signals are read in a format compatible with conventional and industry standards. Analog signals have a continuous spectrum of analog voltage levels. In one embodiment, an analog interface includes an address generator for sequential reading of analog signals and an output amplifier capable of driving a speaker, thereby allowing stored sounds to be reproduced.

In accordance with another embodiment of this invention, integrated on-chip ADC and DAC circuits allow conversion of signals from one form into another. User controllable switches allow selection of (1) input signal form, (2) data storage form, and (3) output signal form. Each selection can be either digital or analog form to provide the flexibility of eight variations of selected formats to fit users' needs. In one embodiment, digital and analog output ports operate in parallel and allow simultaneous output of digital and analog signals representing a value read from the memory array. Accordingly, a digital representation and an analog representation of an analog signal (or an analog representation and a digital representation of a digital signal) can be provided simultaneously.

BRIEF DESCRIPTION OF THE DRAWINGS

Use of the same reference symbols in different figures indicates similar or identical items.

DETAILED DESCRIPTION OF THE PREFERRED EMBODIMENTS

In accordance with an embodiment of the invention, an array of non-volatile memory cells is coupled to both digital and analog read and write circuits. Memory cells in the array store information in user selected formats, a binary format or an analog format. The user can allocate portions of the memory for each storage format. Thus, the memory adapts to changing needs for long term binary storage, error tolerant multi-level digital storage, and analog storage. On-chip digital-to-analog converters (DACs) and analog-to-digital converters (ADCs) allow information to be input in one format and stored or output in another. For example, stored multi-level digital information can be output as an analog value thus eliminating the need for a discrete component DAC coupled to the output port of the memory.

Figure 1:
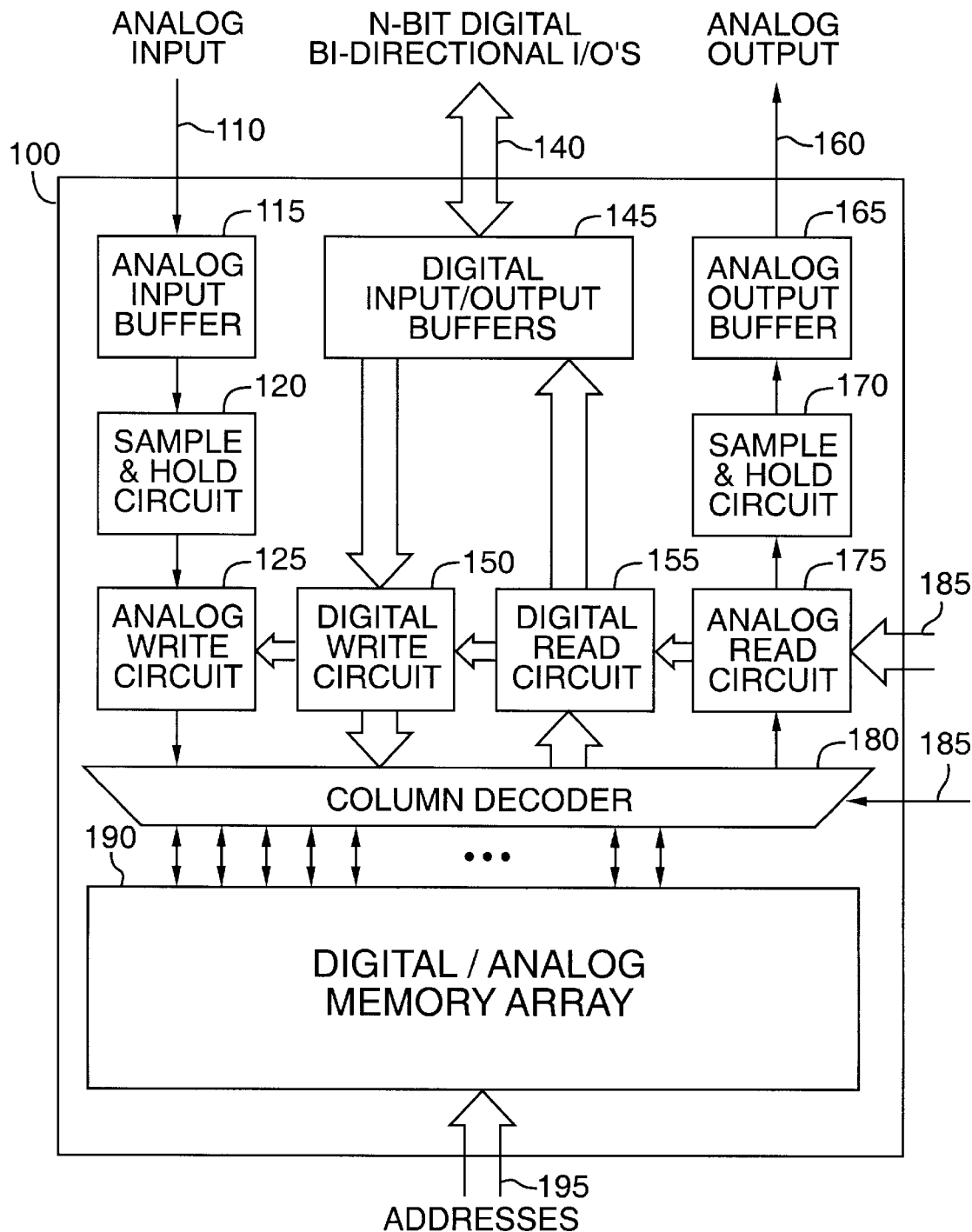
FIG. 1 shows a block diagram of a memory having digital and analog input and output interfaces, in accordance with an embodiment of the invention.

FIG. 1 shows an embodiment of a non-volatile memory 100 having a memory array 190 which can simultaneously hold information in binary format and information in analog format. Memory array 190 is a non-volatile memory such as an EPROM array, an EEPROM array, or a Flash memory array. Such memory arrays are well known in the art and typically contain floating gate transistors which have threshold voltage levels that indicate the information stored. Conventional EPROM, EEPROM, or Flash memory cells may be used in memory array 190. Memory array 190 can also be an array of MNOS memory transistors which have threshold voltage levels that depend on charges trapped in a nitride-oxide interface. For optimum analog storage, memory cells which have (1) low charge leakage and (2) low sensitivity to program and read disturb of threshold voltages are desirable.

Memory 100 has both analog and digital input/output (I/O) interfaces and has two modes for write/read operations, analog mode and binary mode. An address port 195 is for input of a multi-bit address signal used in both modes. In analog mode, the address signal asserted to address port 195 indicates a selected word line and a selected bit line in array 190, and therefore indicates a selected memory cell. A column decoder 180 connects an analog write circuit 125 or an analog read circuit 175 to the selected bit line for writing or reading an analog value. In binary mode, the address signal asserted to address port 195 indicates a selected word line and a set of selected bits lines corresponding to N selected memory cells, where N is an integer and typically a multiple of eight. For writing or reading a binary value, column decoder 180 connects a digital write circuit 150 or digital read circuit 155 to the selected bit lines corresponding to the address signal.

Figure 2A:
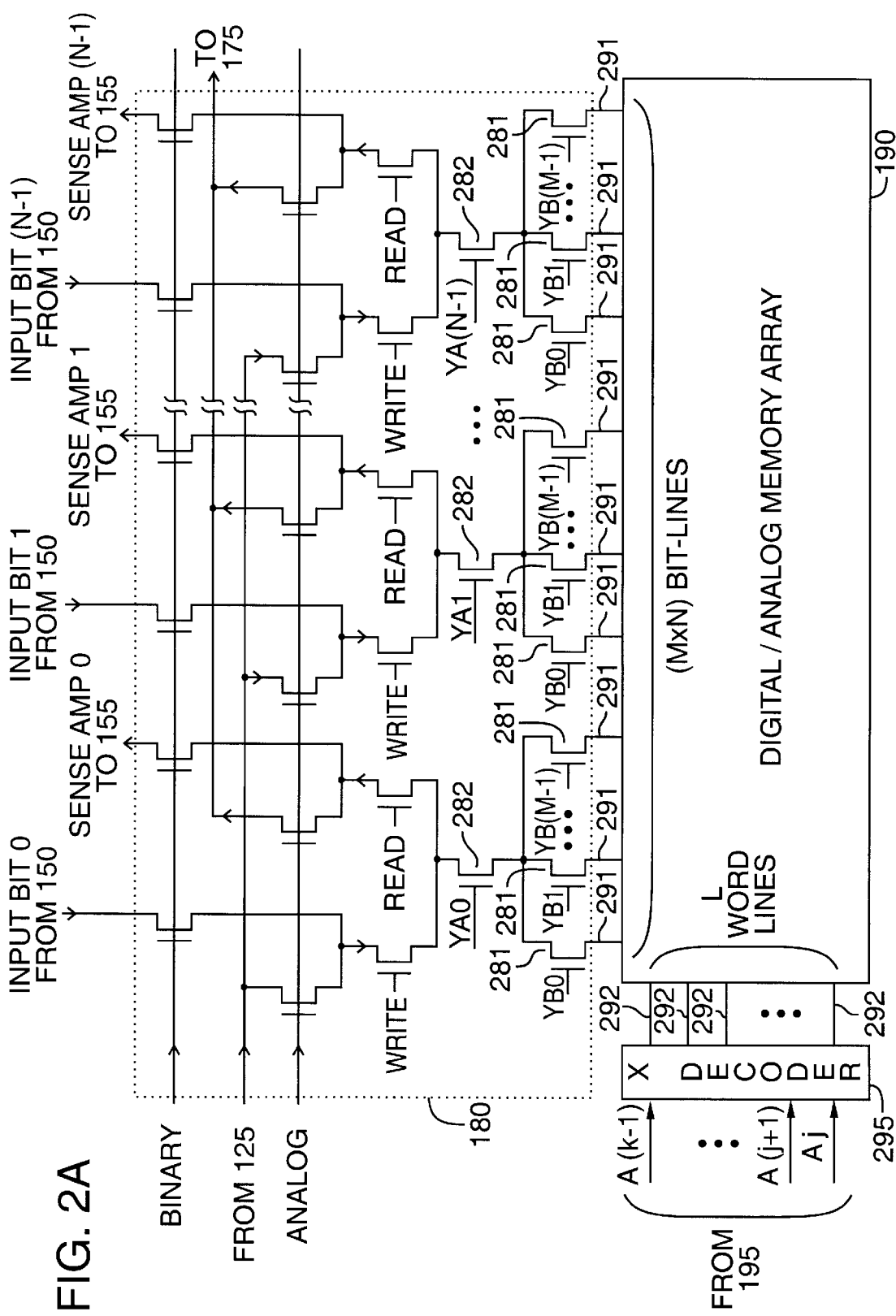
FIGS. 2A and 2B show decoding circuits for the memory of FIG. 1.
Figure 2B:
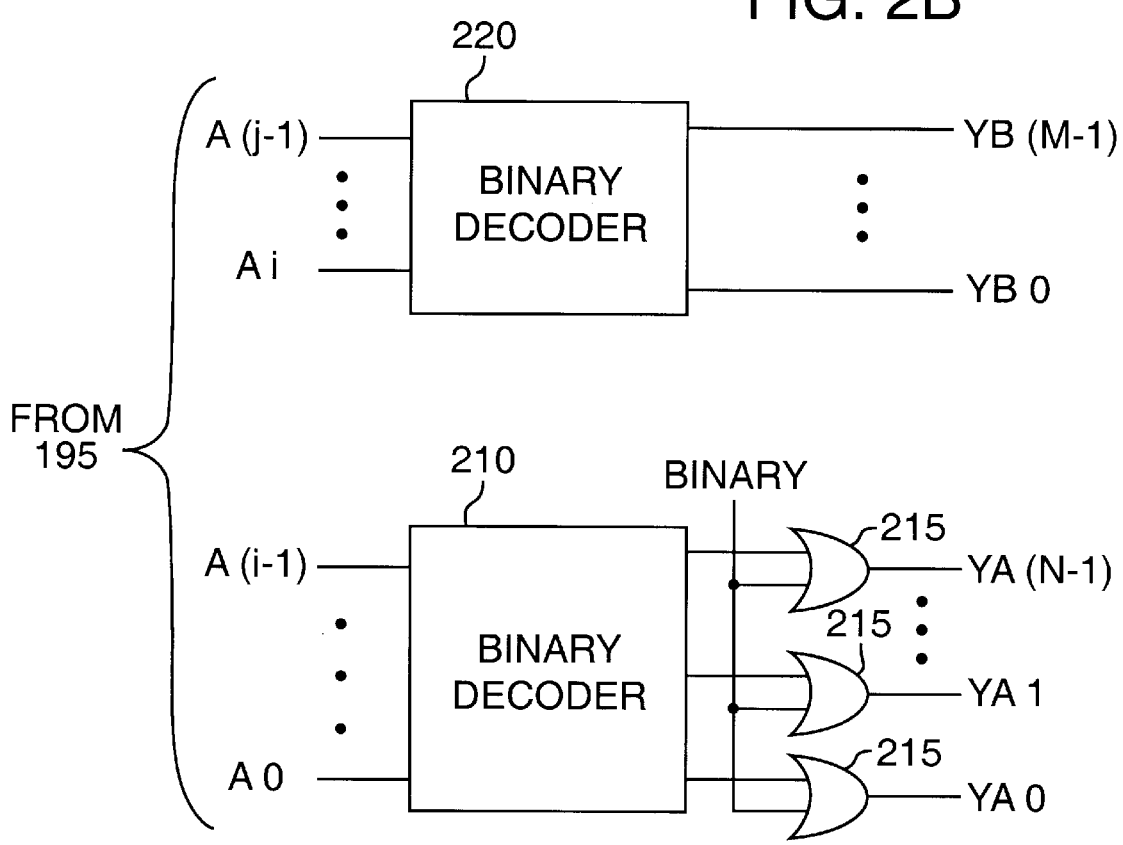

FIGS. 2A and 2B show an embodiment of an address decoding system in accordance with the invention. Memory array 190 contains rows of memory cells coupled to word lines 292 and columns of memory cells coupled to bit lines 291. Word lines 292 are accessed through a conventional row decoder 295. Row decoder 295 selects a word line corresponding to bits Aj to A(k−1) of the address signal from address port 195, and sets the voltages on the selected word line and on unselected word lines. The word line voltages depend on the operation (analog write, analog read, binary write, binary read, or erase) being performed and the type of memory cells in memory array 190.

Bit lines 291 couple to a first level of decode transistors 281. A binary decoder 220 (FIG. 2B) converts address bits Ai to A(j−1) to control voltages YB0 to YB(M−1) for decode transistors 281. Binary decoder 220 asserts the one of signals YB0 to YB(M−1) which corresponds to a binary value represented by address bits Ai to A(j−1). A total of N of transistors 281 are turned on in response to an address signal. A second level of decode transistors contains N transistors 282, each of which couples to a group of M of decode transistors 281. From address bits A0 to A(i−1) and a signal BINARY which indicates whether an operation is in binary mode, a binary decoder 210 and OR gates 215 generate control voltages YA0 to YA(N−1) for decode transistors 282. Binary decoders such as binary decoder 210 and 220, which select a bit line identified by a multi-bit address signal, are well known in the art.

For writing or reading an analog signal, only one of control voltages YA0 to YA(N−1) is high, and only one of control voltages YB0 to YB(M−1) is high. Decode transistors 281 and 282 connect the selected bit line to either analog write circuit 125 (for a write) or analog read circuit 175 (for a read). For reading or writing a binary signal, only one of signals YB0 to YB(M−1) is high, but OR gates 215 force all signals YA0 to YA(N−1) high. Decode transistors 282 simultaneously connect N bit lines 291 to N sense amplifiers (for a read) or to N data input voltages (for a write). In effect, control voltages YB0 to YB(M−1) select one of M words in the selected row, and control voltages YA0 to YA(N−1) select a bit in the selected word. Forcing voltages YA0 to YA(N−1) high allows parallel writing or reading of N bits in the selected word.

In one embodiment of the invention, the user provides signals BINARY and ANALOG via a control port 185 (FIG. 1), to indicate whether an operation is in binary or analog mode. Alternatively, signals BINARY and ANALOG are derived from other control signals or from address signals.

Figure 2C:
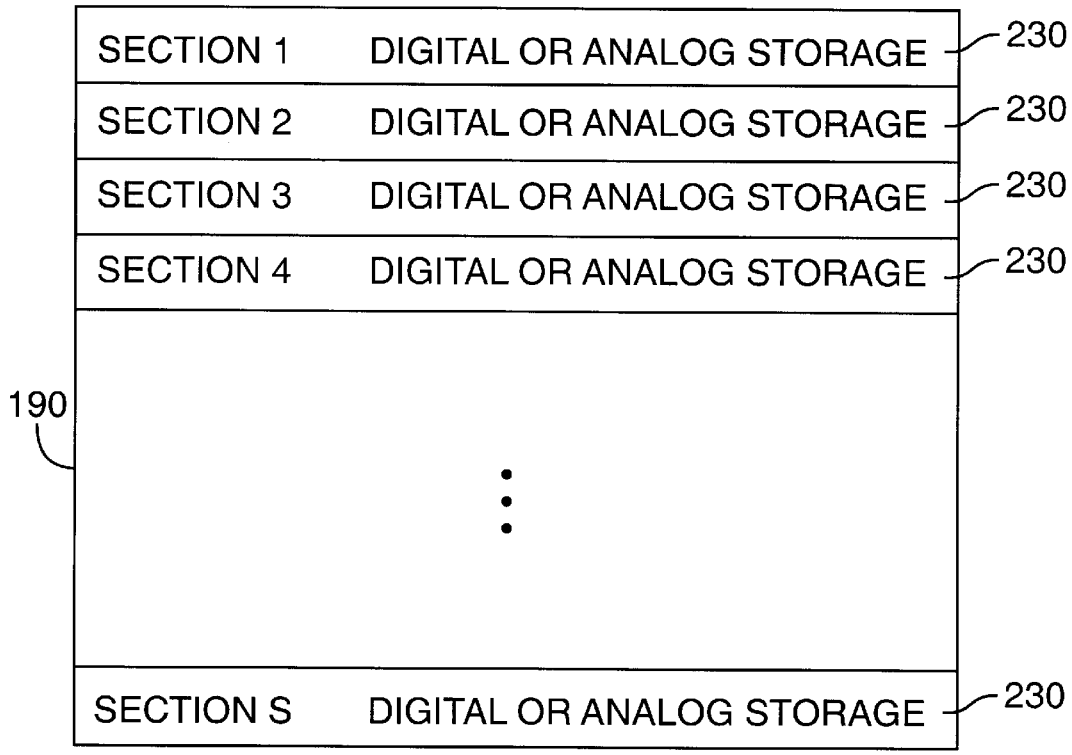
FIGS. 2C and 2D illustrate a partition of a memory array into sections that are independently allocated for either digital or analog storage.
Figure 2D:
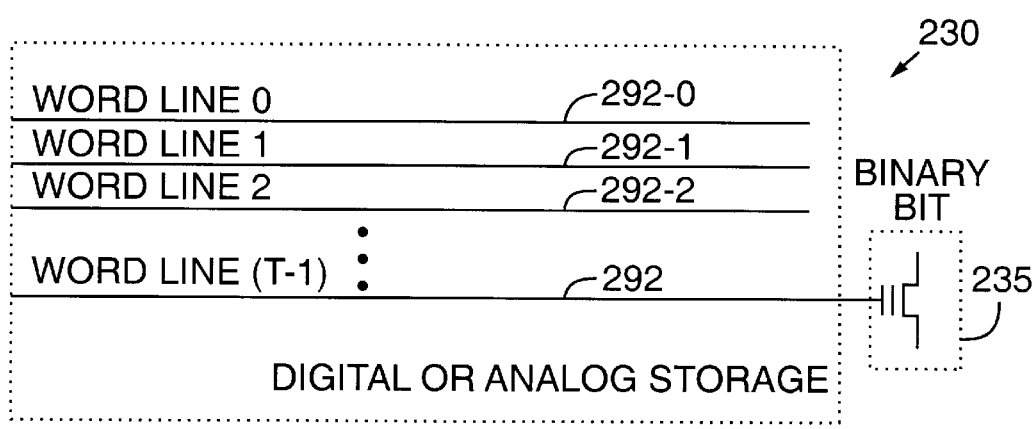

As shown in FIG. 2C, memory array 190 can be partitioned into sections 230 each of which is allocated exclusively for analog storage or exclusively for binary storage. Memory 100 can generate signal BINARY or ANALOG according to whether the selected row is in a section 230 allocated exclusively for binary storage or exclusively for analog storage. FIG. 2D shows an embodiment of the invention, wherein each section 230 in memory array 190 contains one or more rows of memory cells and a flag memory cell 235 which stores a binary value indicating whether the section is allocated for binary or analog data. The user allocates a section for binary or analog storage by writing an appropriate value to the flag memory cell 235 for the section. Flag memory cell 235 can be in a column of memory array 190 or outside array 190. In a preferred embodiment, each section 230 contains one row of memory cells, and flag memory cells 235 form a column in array 190.

When a row address is asserted to row decoder 295, flag memory cell 235 in the section containing the selected word line is read before the requested operation. In the embodiment with one row per section, row decoder 295 asserts the selected word line, and the column containing flag memory cells 235 is read. In another embodiment, flag cell 235 may not be in the selected row. The address signal asserted to row decoder 295 can be altered, for example by changing or masking the least significant address bits of the row address, to select the row containing flag memory cell 235. Signal ANALOG and BINARY are generated according to the binary value read from flag memory cell 235, and the operation proceeds on the original selected row.

For faster read operations, flag memory cells 235 in memory array 190 are read after power-up and the information from flag memory cells 235 is stored in an on-chip buffer which contains fast memory cells such as SRAM cells. During access of memory array 190, the buffer is read to generate signal ANALOG or BINARY when appropriate for the corresponding section of memory array 190. Total access time for memory array 190 can be reduced because the read access time of the on-chip buffer is less than that of flag memory cells 235.

In memory 100 of FIG. 1, the I/O path for binary data includes a digital I/O port 140 (multiple terminals), digital I/O buffers 145, and digital write circuit 150 or digital read circuit 155 and couples to memory array 190 via column decoder 180 and row decoder 295. To write information in binary form, a user asserts an address signal to address port 195, asserts a multi-bit binary data signal to digital I/O port 140 and I/0 buffers 145, and asserts control signals to control port 185. The control signals indicate the operation is a binary mode write. Digital write circuit 150 generates word line, bit line, and source line voltages for writing the multi-bit binary signal in memory array 190. Column decoder 180 connects digital write circuit 150 to the selected bit lines corresponding to the address signal, and write circuit 150 generates voltages on the selected word line and selected bit lines to program the binary value from buffers 145, in the selected memory cells.

To read binary form information, a user asserts an address signal to address port 195 and control signals to control port 185. The control signals indicate the operation is a binary mode read. Row decoder 295 and column decoder 180 connect digital read circuit 155 to the selected word line and bit lines. Read circuit 155 generates a voltage on the selected word line and then senses the binary states of the selected memory cells. The sensed states are written to I/O buffers 145 and asserted on digital data port 140.

Many methods for writing or reading binary values in non-volatile memory cells are known in the art and may be employed in the invention. Table 1 shows example voltages on word lines, bit lines, and sources to read, write and erase typical Flash memory cells.

TABLE 1

| | Selected Word Line | Other Word Lines | Selected Bit Lines | Other Bit Lines | Common Source |
|---|---|---|---|---|---|
| Write | ≈12 V | 0 V | ≈6 V | 0 V | 0 V |
| Read | ≈5 V | 0 V | ≈1.5 V | 0 V | 0 V |
| Erase | 0 V | 0 V | floating | floating | ≈12 V |
| Neg. Gate Erase | ≈−12 V | ≈−12 V | floating | floating | ≈5 V |

Voltages for other types of memory cells are well known in the art.

Analog write and read processes differ from binary write and read process. FIG. 1 shows analog write and read circuits 125 and 175 which are separate from digital write and read circuits 150 and 155. Alternatively, analog and digital read and write paths may share some circuitry.

The analog data paths in memory 100 have an input port 110 (single terminal) and an output port 160 (single terminal). To write information in analog form, a user asserts an address signal to address port 195, an analog signal to analog input port 110, and control signals to port 185. The control signals indicate the operation is an analog write, and cause a sample-and-hold circuit 120 to sample the analog signal from analog input port 110 and an analog input buffer 115. Row decoder 295 and column decoder 180 connect analog write circuit 125 to the selected word line and bit line corresponding to the address signal, and analog write circuit 125 generates voltages on the selected word line and bit line to change the threshold voltage of the selected memory cell to a level which indicates the sampled value of the analog signal.

To produce an analog signal from memory array 190, a user asserts an address signal to address port 195, and control signals to a port 185. Row decoder 295 and column decoder 180 connect analog read circuit 175 to the selected word line and bit line. Analog read circuit 175 generates a voltage on the selected word and bit lines to sense the threshold voltage of the selected memory cell and generates an output voltage from the sensed threshold voltage. A sample-and-hold circuit 170 holds the generated output voltage to maintain an output analog signal through an output buffer 165. In many applications, the analog output signal is continuously generated and represents a waveform such as a recorded sound.

Figure 3A:
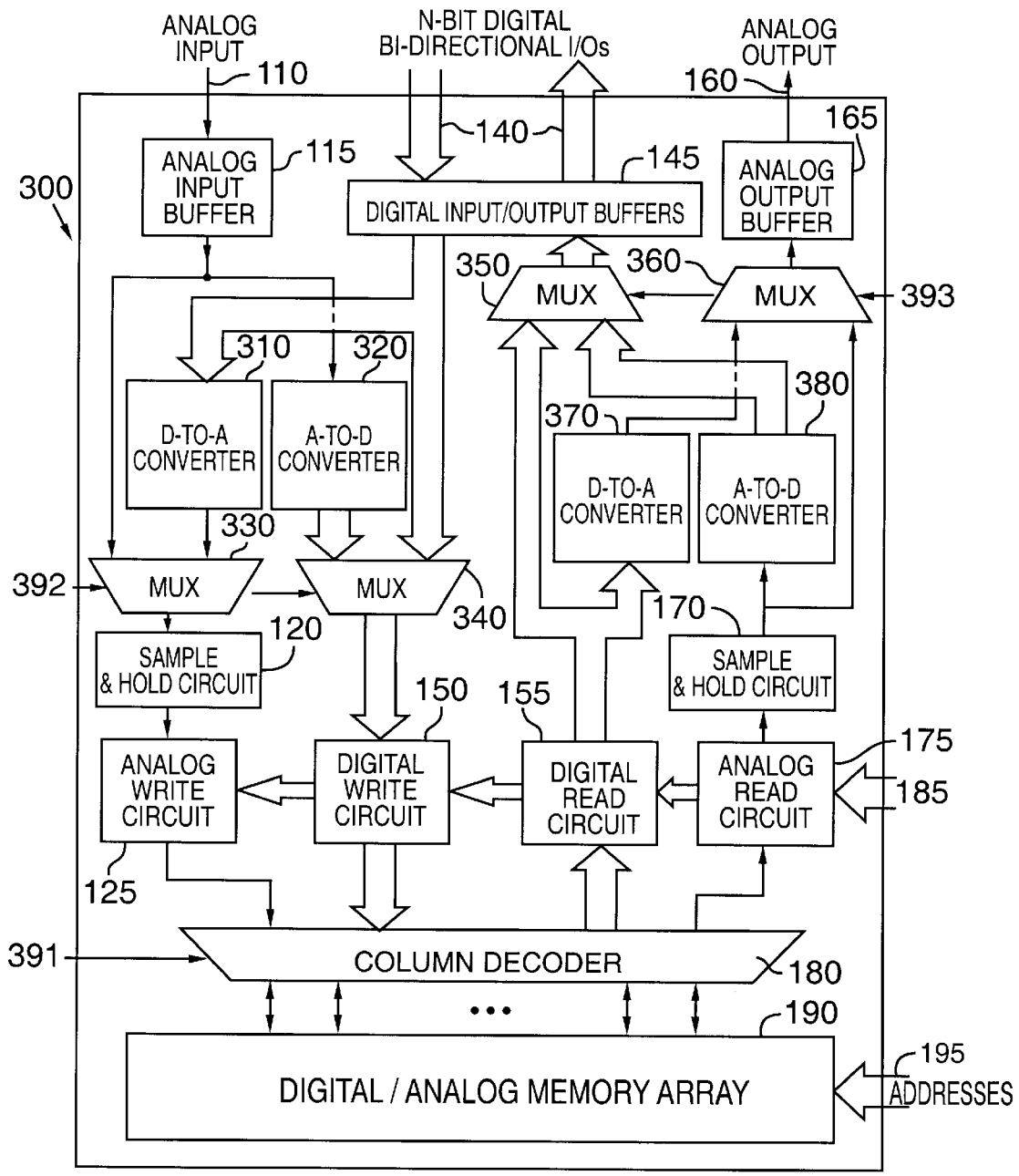
FIGS. 3A and 3B are block diagrams of memories having on-chip DACs and ADCs and user control of input format, storage format, and output format in accordance with two embodiments of the invention.

FIG. 3A shows an embodiment of a non-volatile memory 300 in accordance with another embodiment of the invention. Circuit blocks identified with the same reference symbols as those in FIG. 1 are similar or identical to corresponding circuit blocks and are described above in regard to FIG. 1. Memory 300 is a monolithic semiconductor structure containing a digital-to-analog converter (DAC) 310 and an analog-to-digital converter (ADC) 320 in the input interface and a DAC 370 and an ADC 380 in the output interface. Converters 310, 320, 370, and 380 allow information storage in a format that differs from the format in which the information is input or output.

For writing information in memory 300, a user provides an input data signal and control signals 391 and 392. Control signal 392 indicates whether the input data signal is in analog or binary format, and control signal 391 indicates the storage mode (binary or analog) for the input data signal. DAC 310 converts a digital input data signal to analog form. ADC 320 converts an analog input data signal to multi-bit binary form. In analog storage mode, multiplexer 330 selects either an analog data signal from analog input buffer 115 or an analog output voltage from DAC 310 according to whether control signal 392 indicates the input data signal is analog or digital. Sample-and-hold circuit 120 samples the output voltage from multiplexer 330, and analog write circuit 125 writes the analog value to the memory cell selected by column decoder 180 and row decoder 295 as described above in regard to FIG. 1. In binary storage mode, column decoder 180 connects digital write circuit 150 to the selected bit lines. The digital signal written comes from multiplexer 340 which selects either a digital data signal from digital I/O buffers 145 or the output voltage from ADC 320 according to whether control signal 392 indicates the input data signal is digital or analog.

For reading information, a user provides control signal 391 indicating the storage mode (binary or analog) and control signal 393 indicating the desired form for output data signals. Alternatively, control signal 391 may be derived from a binary value read from flag memory cell 235 within the section accessed or from the address signal. In analog storage mode, column decoder 180 connects analog read circuit 175 to a selected bit line. Sample-and-hold circuit 170 asserts the analog signal from analog read circuit 175 to a multiplexer 360. ADC 380 converts the analog signal to multi-bit binary form which is asserted to multiplexer 350. In binary mode, column decoder 180 connects digital read circuit 155 to selected bit lines. The digital signal from digital read circuit 155 is asserted to multiplexer 350 and converted by DAC 370 to analog form before being asserted to multiplexer 360. Since an output path through multiplexer 350 is parallel to an output path through multiplexer 360, the user can choose whether the output signals are in analog form on analog output port 160, in multi-bit digital form on digital data port 140, or both.

Figure 3B:
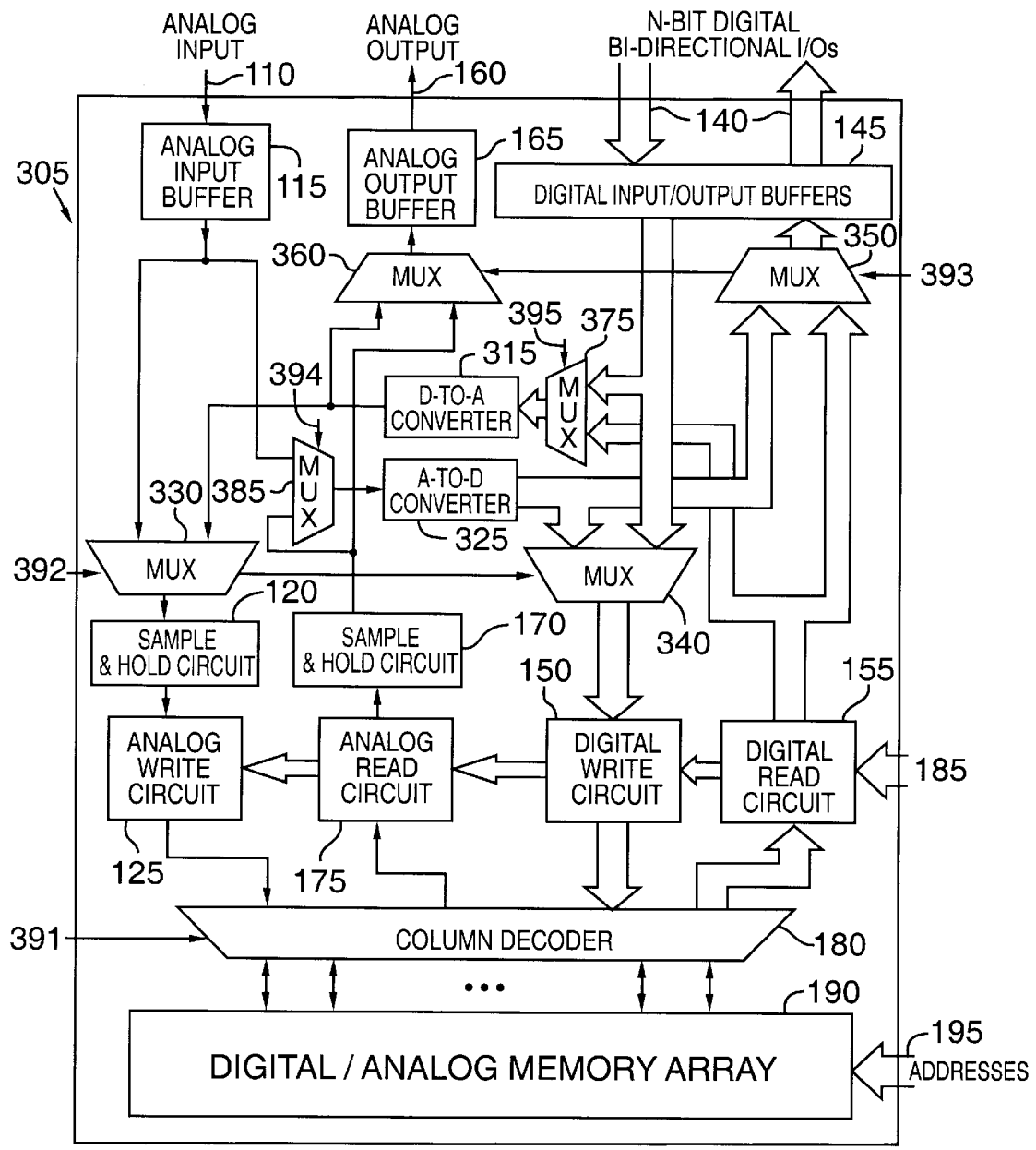

FIG. 3B shows an embodiment of a monolithic memory 305 where DACs 310 and 370 of memory 300 are replaced by a DAC 315 and a multiplexer 375 which connects DAC 315 in the input or output data path so that DAC 315 selectably converts input or output digital signals. Similarly, ADCs 320 and 380 of FIG. 3A are replaced by an ADC 325 and a multiplexer 385 which selectably connects ADC 325 to the input or output data path. Select signals 394 and 395 for multiplexers 375 and 385 depend on control signals such as signal 392 or 393. Providing DAC 315 and multiplexer 375 (and/or ADC 325 and multiplexer 385) instead of DACs 310 and 370 (and/or ADCs 320 and 380) typically reduces the chip area required to fabricate an analog/digital memory and therefore reduces memory cost.

Memory 305 provides flexibility for a variety of uses. For example, memory 305 can function as an analog-to-digital (or digital-to-analog) converter by asserting an analog (or digital) input signal to input port 110 (or 140) and configuring multiplexers 385 and 350 (or multiplexers 375 and 365) to route an input signal through converter 325 (or 315) to output port 140 (or 160) without accessing memory array 190. Also, information stored in one part of memory array 190 in one form can be read, converted into another form, and rewritten into another part of memory array 190 without accessing any of I/O ports 110, 140, and 160. For example, if analog data is acquired at a rate greater than the rate at which analog write circuit 125 can write the data, it may still be possible to convert the acquired analog data to binary form through ADC 325 and then use the faster digital write circuit 150 to write the acquired data in binary form, to memory array 190, in real time as the data is acquired. When memory 305 is otherwise idle, digital values can be read, converted to analog form, and written back to memory array 190 in analog form to reduce the amount of memory needed to store the acquired data.

Converting a multi-bit binary signal to analog form creates a signal which has one of a set of discrete levels, and analog write circuit 125 sets the threshold voltage of a memory cell to one of a set of discrete values when storing such signals. In the absence of errors, converting the stored signal back to multi-bit binary form during reading provides the value stored. Accordingly, analog storage of digital values stores multiple bits of information in a single memory cell and increases storage density. However, multi-level memory cells are more sensitive to noise and charge leakage because separation between adjacent threshold voltage levels is less in multi-level memory cells than in conventional binary memory cells. Accordingly, unless accurate tracking of charge leakage is performed, multi-level memory is better suited to error-tolerant applications such a digital storage of audio and video signals. Table 2 shows various combinations of input, storage, and output data formats and typical applications for each combination.

TABLE 2

| Input Interface | Storage Format | Output Interface | Typical Applications |
|---|---|---|---|
| Digital | Digital (Binary) | Digital | (1) Conventional digital data storage. |
| Digital | Digital (Binary) | Analog | (2) Applications which convert digital data to analog form (e.g. voice synthesis |

TABLE 2-continued

| Input Interface | Storage Format | Output Interface | Typical Applications |
|---|---|---|---|
| | | | using pulse code modulated [PCM] digital input). |
| Digital | Analog (Multi-level) | Digital | (3)[a] Digital Testing of Analog Storage. [b] Same as (1) above, but saves storage area. |
| Digital | Analog (Multi-level) | Analog | (4) Same as (2), but saves storage area. |
| Analog | Digital (Binary) | Digital | (5) Applications requiring a digital representation of an input analog signal, e.g. LED or LCD display and long-term data accuracy. |
| Analog | Digital (Binary) | Analog | (6) Analog data stored in digital format to enhance long-term data accuracy. |
| Analog | Analog | Digital | (7) Same as (5), but saves storage area. |
| Analog | Analog | Analog | (8) Analog data storage (e.g. audio & video signal storage) |
| Analog | None | Digital | Analog to digital conversion |
| Digital | None | Analog | Digital to analog conversion |

U.S. patent app. Ser. No. 08/333,381 which was incorporated by reference above describes an analog memory having an on-chip DAC coupled to an input port and an on-chip ADC coupled to an output port. A further advantage of on-chip DAC 310 and ADC 380 is simplified testing of analog storage. Typically, analog memory is tested by writing a range of analog input signals, reading analog signals from the memory cells, and comparing input and output analog signals. With on-chip DAC 310 and ADC 380, analog write circuit 125 and analog read circuit 175 can be tested using digital device testing equipment which is usually less costly than analog testing equipment. The same equipment can also test digital storage functions. This reduces the cost of testing analog memory during manufacture.

An example test procedure for memory 300 includes a binary test and an analog test. The binary test erases array 190, programs every cell in memory array 190 with binary values according to a test pattern, and then reads the binary values. Verifying erased and programmed levels match the test pattern detects defects in memory array 190 and in the digital data read and write paths. Many suitable test patterns are known in the art. For example, a diagonal test pattern sets bits along a diagonal of the array so that only one cell in each row or column is set. This is useful for checking the integrity of memory array 190, column decoder 180, and row decoder 295. A checker board pattern sets every other memory cell. Using two or more patterns during binary testing, for example, programming and verifying a first pattern followed by programming and verifying a second pattern that is complementary to the first, provides good coverage for detecting defective memory cells in memory array 190.

Digital test equipment can perform the analog test by storing digital values in analog form in a sampling of the memory cells in memory array 190 then comparing the digital form of the stored analog values to the digital values written. The analog test need only test a sampling of memory cells because the digital test provides complete coverage for detecting defective memory cells.

Figure 4A:
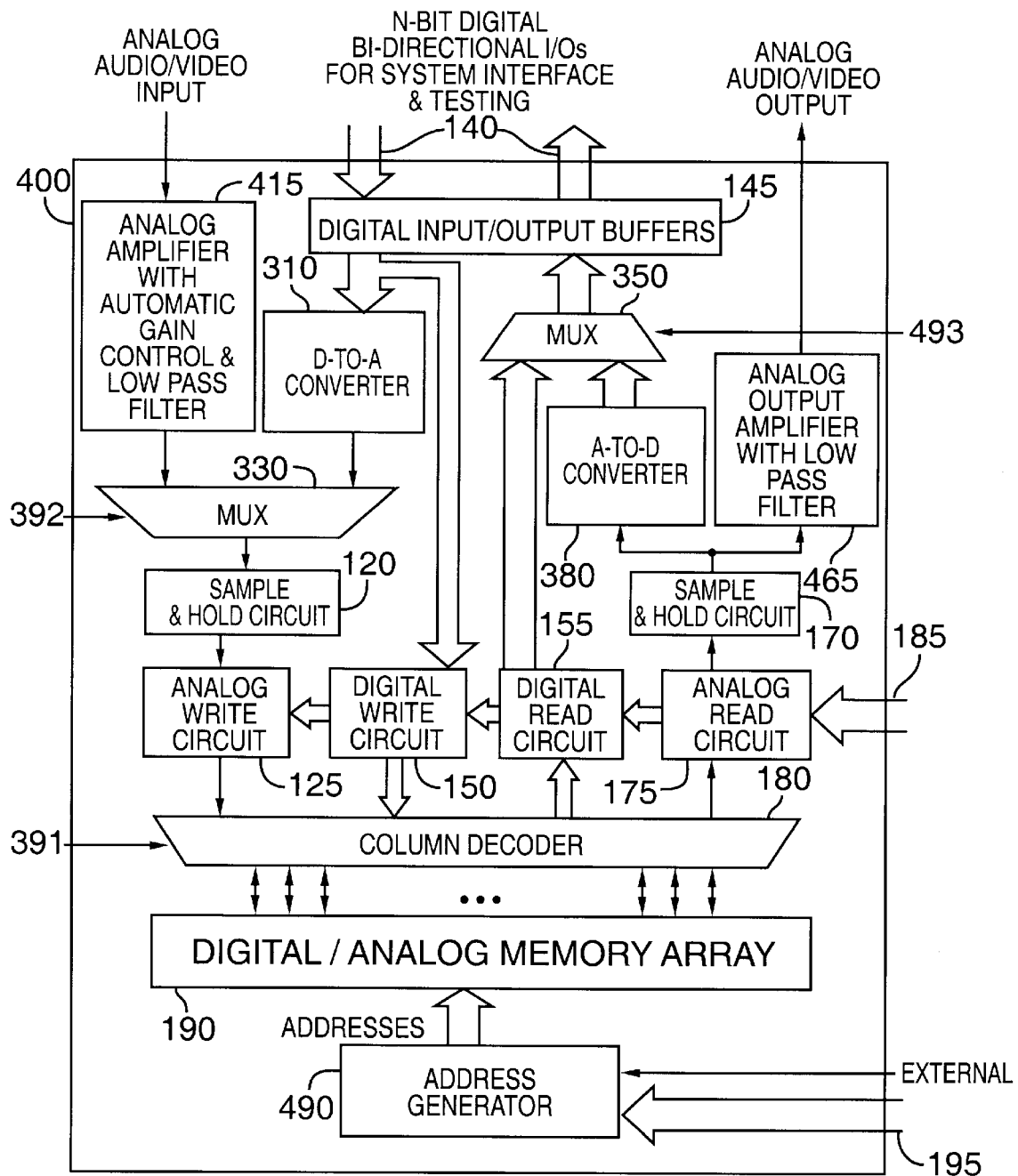
FIG. 4A is a block diagram of an embodiment of the invention adapted for audio and video recording and playback.

FIG. 4A shows a non-volatile memory 400 specially adapted for recording and playing analog audio and/or video signals. Circuit blocks identified with the same reference symbols as those in preceding figures are similar or identical to the corresponding circuit blocks described above. A primary difference between memory 300 (FIG. 3A) and memory 400 is that memory 400 includes an internal address generator 490 which provides serial addresses to record or playback continuous analog signals.

Figure 4B:
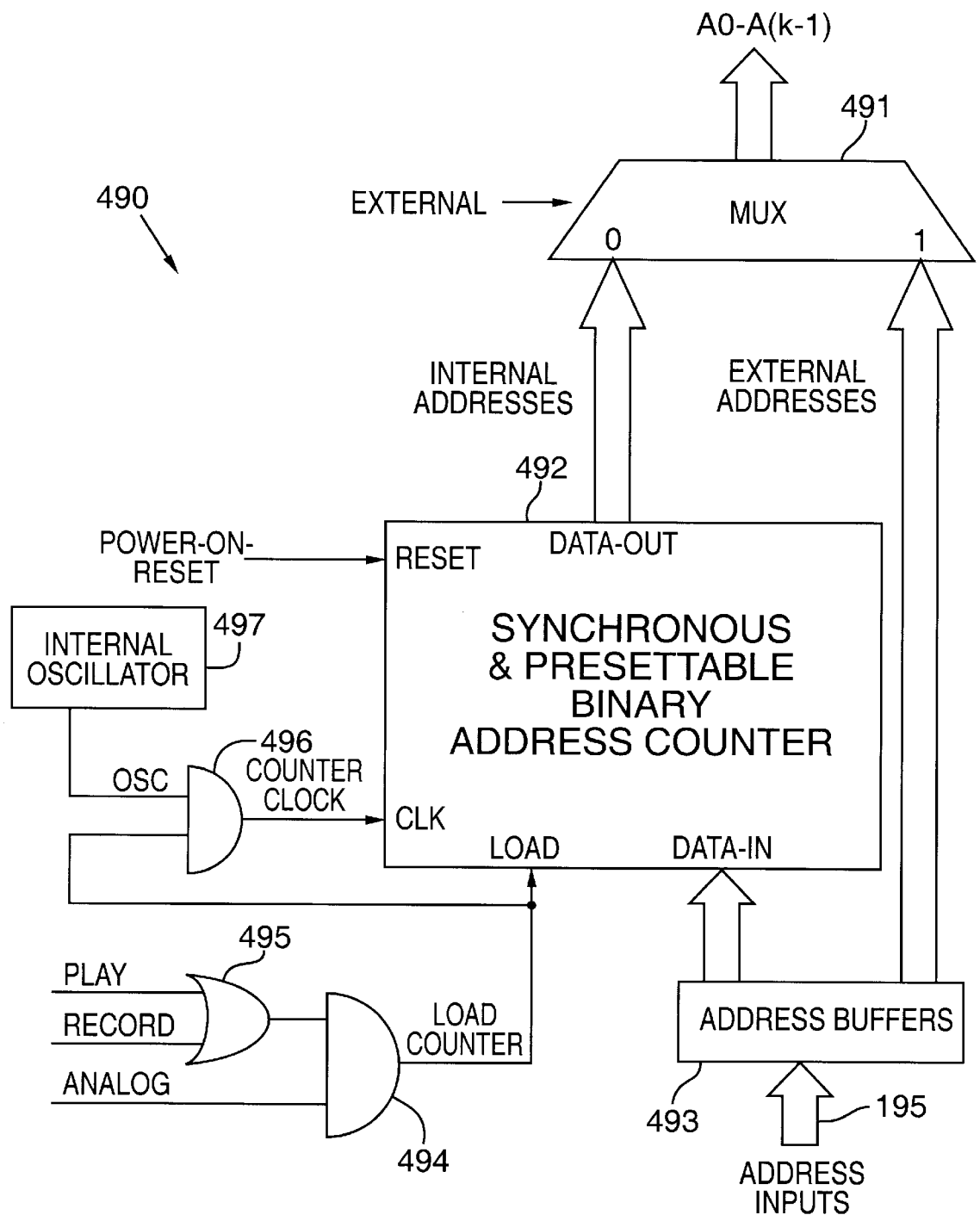
FIG. 4B is a block diagram of internal sequential addressing circuit used in the embodiment of FIG. 4A.

FIG. 4B shows a block diagram of an embodiment of address generator 490. Address generator 490 contains a binary address counter 492. Address counter 492 has a data input port coupled to address port 195 via an address buffer 493 and loads an address from address buffer 493 when a load signal is asserted. The address can be supplied externally. Alternatively, an on-chip library index (not shown) may contain starting addresses of a variety of sound clips or messages. For example, a portion of memory array 190 can be allocated as the library index for such addresses. The starting addresses are loaded from the library index into address counter 492 to begin playing a recorded sound.

In the example shown, a signal ANALOG indicating analog mode is asserted before memory 400 begins recording or playing a sound. The user generates a signal RECORD to begin recording a sound or a signal PLAY to begin playing a recorded sound. When signal RECORD or PLAY is asserted, AND gate 494 asserts the load signal, and address counter 492 loads a starting address from address buffers 493. A signal POWER-ON-RESET resets address counter 492 to a default address (zero) upon power up.

A multiplexer 491 selects either the address directly from address buffer 493 or the address from counter 492 and provides address bits A0 to A(k−1) to memory array 190 (column decoder 180 and row decoder 295). During recording or playing of an analog sound signal, address counter 492 increments according to a clock signal OSC from an internal oscillator 497, and an analog value is written to or read from memory array 190 at the address indicated by address counter 492. Internal oscillator 497 (or alternatively an external source) generates signal OSC at a frequency for sampling of the analog sound signal. Typical, sampling frequencies are from about 4 KHz to over 40 KHz. When the user deasserts signal RECORD or PLAY, recording or playing stops.

When digital write circuit 150 or digital read circuit 155 writes or reads data, address counter 492 stops counting, and address port 195 provides the address signal. Digital values can be written in binary form for example to provide digital information such as recording time, date, title or any other information which accompanies an analog sound signal. For voice synthesis applications, digital I/O port 140 also allows an external digital processor to generate a series of digital values and write the digital values to memory array 190 in analog form through DAC 310, multiplexer 330, sample-and-hold circuit 120, and analog write circuit 125. Further, the external digital processor can digitally process and filter recorded analog values which are read and converted to digital form via analog read circuit 175, sample-and-hold circuit 170, and ADC 380. Data which the external digital processor stores in analog form in memory array 190 are played in the same sequential manner as recorded signals.

Memory 400 of FIG. 4A contains an input amplifier 415 with an automatic gain control and a low pass filter and an output amplifier 465 with a low pass filter. Input amplifier 415 is adapted for processing of an input analog audio signal directly from a microphone or other audio signal input device. Output amplifier 465 is capable of directly driving a speaker.

Although the invention is described with reference to particular embodiments, the description is only an example of the invention's application and should not be taken as a limitation. In particular, although embodiments of the invention are described for storing audio or voice signals, the memory described herein can also store video signals or any other digital or analog signals. Various other adaptations and combinations of features of the embodiments disclosed are within the scope of the invention as defined by the following claims.

We claim:

1. A method for storing data in a memory, comprising:
   writing the data in the memory as digital values during acquisition of the data wherein writing stores the digital values in digital form in the memory;
   reading the digital values from the memory cells;
   converting the digital values as read into analog values using a digital-to-analog converter that is internal to the memory; and
   storing the analog values in analog form in the memory.

2. The method of claim 1, wherein each of the digital values is written in a plurality of memory cells in a memory array of the memory, and each of the analog values is stored in a single memory cell in the memory array.

3. The method of claim 1, wherein the memory comprises a single integrated circuit in which the writing, converting, and storing steps are performed.

4. The method of claim 3, wherein the memory is a non-volatile memory.

5. The method of claim 1, wherein the acquisition of the data comprises:
   sampling an analog signal to generate a series of samples; and
   converting the series of samples to the digital values to be written in the memory.

6. The method of claim 5, wherein an analog-to-digital converter that is internal to the memory converts the series of samples to the digital values to be written.

7. The method of claim 5, wherein the steps of reading, converting, and storing are performed after the acquisition of the data.

8. The method of claim 1, wherein:
   the analog signal is sampled at a first rate; and
   the digital values are written at the first rate.

9. The method of claim 8, wherein storing the analog values comprises writing the analog values at a second rate that is slower than the first rate.

10. The method of claim 1, wherein the digital values are written at a first rate, and storing the analog values comprises writing the analog values at a second rate that is slower than the first rate.

11. The method of claim 1, wherein:
    writing the digital values comprises writing to a first section of the memory; and
    storing the analog values comprises writing to a second section of the memory.

12. The method of claim 11, wherein a single array of memory cells contains the first and second sections of the memory.

13. The method of claim 11, wherein memory cells in the first section are substantially identical to memory cells in the second section.

14. The method of claim 1, wherein storing the analog values comprises writing the analog values to memory cells which are substantially identical to memory cells in which the digital values were written.

* * * * *